United States Patent [19]
Oitate et al.

[11] Patent Number: 5,128,269
[45] Date of Patent: Jul. 7, 1992

[54] METHOD FOR MONITORING UNUSUAL SIGNS IN GAS-CHARGED APPARATUS

[75] Inventors: Toshiro Oitate, Yokohama; Yasuo Kinjo, Ichikawa; Masami Ikeda, Kawasaki, all of Japan

[73] Assignee: Kabushiki Kaisha Toshiba, Kawasaki, Japan

[21] Appl. No.: 330,130

[22] Filed: Mar. 29, 1989

[30] Foreign Application Priority Data

Mar. 29, 1988 [JP] Japan ................... 63-73319

[51] Int. Cl.⁵ .............. G01N 33/00; G01M 3/04
[52] U.S. Cl. ..................... 436/126; 73/40.7; 73/46; 73/49.1; 436/3
[58] Field of Search .......... 73/40.7, 46, 49.1; 436/3, 126; 422/202, 208

[56] References Cited

U.S. PATENT DOCUMENTS

| | | | |
|---|---|---|---|
| 2,853,540 | 9/1958 | Camille et al. | 174/17 |
| 3,186,214 | 6/1965 | Roberts | 73/40.7 |
| 3,364,729 | 1/1968 | Yearwood | 73/40.7 |
| 3,487,677 | 6/1970 | Molitor | 73/40.7 |
| 3,577,769 | 5/1971 | Roberts | 73/40.7 |
| 3,585,845 | 6/1971 | Cornell et al. | 73/40.7 |
| 3,738,158 | 6/1973 | Farrell et al. | 73/40.7 |
| 4,485,367 | 11/1984 | Hashizume | 336/57 |
| 4,549,817 | 10/1985 | Felber | 374/152 |

FOREIGN PATENT DOCUMENTS

| | | |
|---|---|---|
| 0121267 | 10/1984 | European Pat. Off. |
| 0153637 | 9/1985 | European Pat. Off. |
| 0159440 | 10/1985 | European Pat. Off. |
| 1488883 | 8/1969 | Fed. Rep. of Germany |
| 56-78308 | 6/1981 | Japan |
| 62-76472 | 4/1987 | Japan |
| 63-242125 | 10/1988 | Japan |
| 2004128 | 3/1979 | United Kingdom |

*Primary Examiner*—James C. Housel
*Assistant Examiner*—Thomas E. Daley
*Attorney, Agent, or Firm*—Foley & Lardner

[57] ABSTRACT

A method for monitoring unusual signs such as partial heatings and partial electric discharges in an apparatus to be monitored, in which a sealed gas is enclosed into a tank containing the apparatus, and at least one of monitor gases represented by formulas (I) and (II), $$C_nX_{2n} \qquad (I)$$

$$C_nX_{2n+2} \qquad (II)$$

wherein X is at least one of H, F, Cl, Br and I, and n is one of 2, 3, 4 and 5, is charged into the tank, and in which a reaction product gas of the monitor gas, generated due to an abnormality of the apparatus to be monitored, is detected using a detector. A gas-charged apparatus including an unusual sign monitor is also disclosed.

7 Claims, 9 Drawing Sheets

METHOD FOR MONITORING UNUSUAL SIGNS IN GAS-CHARGED APPARATUS

BACKGROUND OF THE INVENTION

1. Field of the Invention

The present invention relates to a method for monitoring unusual signs such as partial heatings and electric discharges in a gas-charged apparatus such as a gas-insulated transformer, gas-insulated switchgear, gas circuit breakers and turbine and the like, and a gas-charged apparatus including an unusual sign monitor for catching the unusual signs.

2. Description for the Background Art

In a conventional oil-immersed electric apparatus such as a transformer, a main body is contained in a tank filled with an insulating oil for insulating and cooling the main body. When anything unusual such as a trouble with an unusual heating or a partial electric discharge by a corona arc happens in the tank, the insulating oil is ignited to cause an explosion, and, in the worst case, the insulating oil is scattered in all directions to bring about a secondary accident such as a fire of surrounding buildings and the like. Nowadays, as the electric power demand largely increases, it becomes difficult to ensure the installation place for such electric apparatuses, and thus the electric apparatuses such as the transformer are often installed in the surroundings of the streets or the underground of the buildings. Accordingly, the electric apparatus having a higher safety, which is capable of preventing a fire and environmental disruption, has been demanded.

In order to satisfy these demands, a gas-insulated electric apparatus such as a transformer, which is compact, light in weight and much reliable with the prevention of disasters as compared with the oil-immersed electric apparatus, has been employed. In such a gas-insulated electric apparatus, a main body is equipped within a container, and an insulating gas as an insulating and cooling medium for the main body is enclosed in the container instead of the conventional insulating oil. This insulating gas requires (1) a high dielectric strength, (2) a thermal stability and inertness, (3) a non-flammability, (4) a harmlessness to a human being, (5) a good thermal conductivity and so forth. For instance, a gas $SF_6$ satisfying these properties is used in the electric apparatus such as the transformer. Hence, in the gas-insulated electric apparaus, even when the temperature in the container increases to abnormally high due to an occurrence of a trouble therein, there is no feat to cause a fire, and no bad influence is given to the surroundings. Thus, the gas-insulated apparatus may be suitably installed in the streets and the underground of the buildings.

In the electric apparatus such as the transformer, the stop of the operation due to the accident or trouble should be completely avoided from the standpoint of the stable power supply. It is apparent from the importance of the electric power energy that a stoppage of power supply due to an accident affects a number of bad social and economical influences to a various portions concerned. In case of a transformer, an eddy current is generated in the structural members of the body and container by a leakage flux to cause many abnormalities such as unusual partial heatings and a generation of heat due to incomplete contact of the conductive members or due to an insulation deterioration caused by a partial electric discharge. These abnormal states bring about a big accident to cause the power stoppage. Therefore, in the electric apparatus, it is necessary to provide an abnormality monitoring technique which always monitors occurrence of abnormalities in order to detect signs of troubles in the slight stages, and takes necessary measure to prevent an accident from occurring. Consequently, the reliability of the electric apparatus is further raised and the stable power supply can be achieved.

In the conventional oil-immersed electric apparatus such as the transformer, the abnormality monitoring is conducted as follows. That is, when a slight local heating as a premonitory stage following an accident is generated, the insulating oil is heated, and, when the temperature of the heated insulating oil is raised to 150° to 200° C., the insulating oil is decomposed to generate a gas. Then, the generated gas is always or periodically detected, thereby monitoring the abnormality of the apparatus.

In the conventional gas-insulated electric apparatus, the insulating gas enclosed in the tank is always or periodically analyzed to perform the abnormality monitoring. However, as described above, the insulating gas such as $SF_6$ gas is thermally stable and inert, which means the insulating gas is not decomposed by the slight local heating. This is disadvantageous in the abnormality monitoring. That is, it is quite difficult to detect the premonitory stage of the slight trouble or accident by analyzing the insulating gas.

Further, when the abnormality monitoring is carried out, it is necessary to able to monitor the abnormalities such as local heating not only in predictable portions but also unexpected portions. The electric apparatus such the gas-insulated transformer is designed with sufficient thermal strength and insulating strength, but an occurrence of troubles in the unexpected portions can not be ignored. The detection and prevention of such unexpected troubles largely improve the reliability of the apparatus.

SUMMARY OF THE INVENITON

Accordingly, it is an object of the present invention to provide a method for monitoring unusual signs such as partial heatings and electric discharges in a gas-charged apparatus without giving any influences to the inherent natures such as the insulating and cooling abilities, to exactly prevent troubles and accidents.

In is another object of the present invention to provide a gas-charged apparatus including unusual sign monitor, free from aformentioned defects and disadvantages of the prior art, which is capable of monitoring unusual signal such as parital heatings and electric discharges in a gas-charged apparatus without giving any influences to the inherent natures such as the insulating and cooling abilities, to exactly prevent troubles and accidents.

In accordance with one aspect of the present invention, there is provided a method for monitoring unusual signs in an apparatus to be monitored, comprising enclosing a insulating gas into a tank containing the apparatus, charging at least one of monitor gases represented by formulas (I) and (II), $$C_nX_{2n} \quad \text{(I)}$$

$$C_nX_{2n+2} \quad \text{(II)}$$

wherein X is at least one of H, F, Cl, Br and I, and n is one of 2, 3, 4 and 5, into the tank, and detecting a reaction product gas of the monitor gas, generated due to an abnormality of the apparatus to be monitored, using a detector.

In accordance with another aspect of the present invention, there is provided a gas-charged apparatus, comprising a tank, containing an apparatus to be monitored, and enclosing a insulating gas and at least one one of monitor gases represented by formulas (I) and (II), $$C_nX_{2n} \qquad (I)$$

$$C_nX_{2n+2} \qquad (II)$$

wherein X is at least one of H, F, Cl, Br and I, and n is one of 2, 3, 4 and 5, and means for detecting a reaction product gas of the monitor gas, generated due to an abnormality of the apparatus to be monitored, to monitor unusual signs in the apparatus.

BRIEF DESCRIPTION OF THE DRAWINGS

These and other objects, features and advantages of the present invention will more fully appear from the following description of the preferred embodiments thereof with reference to the accompanying drawings, in which.

DESCRIPTION OF THE PREFERRED EMBODIMENTS

Figure 1:
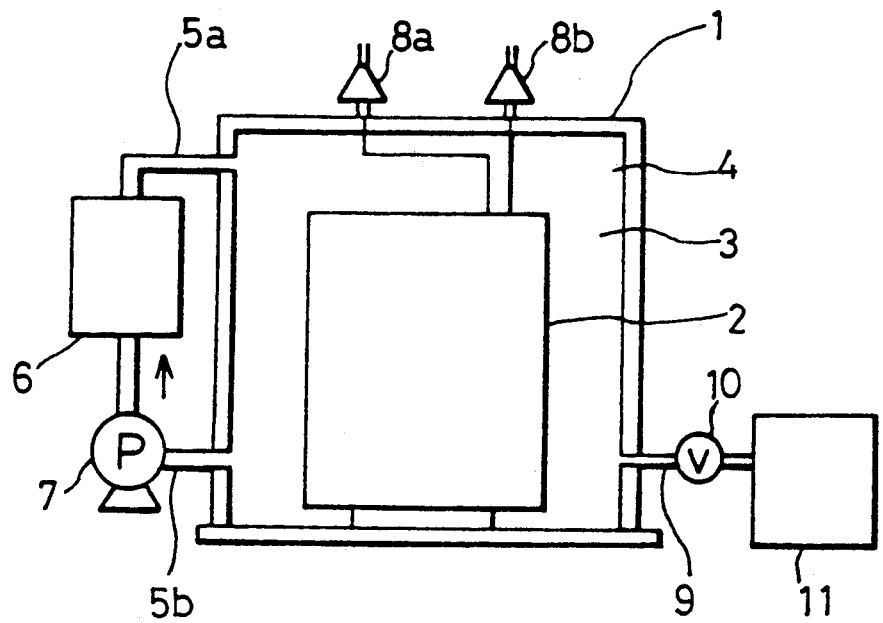
FIG. 1 is a schematic view of one embodiment of a gas-charged apparatus including an unusual sign monitor for monitoring unusual signs such as partial heatings and electric discharges according to the present invention.

Referring now to the drawings, wherein like reference characters designate like to corresponding parts throughout the several views and thus the description thereof may be omitted for the brevity, as occasion demands, there is shown in FIG. 1 a first embodiment of a gas-charged apparatus including an unusual sign monitor for monitoring unusual signs such as partial heatings and electric discharges according to the present invention.

In FIG. 1, an electric apparatus such as a gas-insulated transformer, a gas-insulated switch and a turbine is schematically illustrated. The apparatus proper 2, e.g., coils around a core in the case of transformer, is palced in"; tank 1. In the tank 1, a insulations gas 3 having inertness and nonflammability such as $SF_6$ gas, air and the like is enclosed for insulating and cooling the apparatus 2, and at least one of monitor gases 4 such as $C_2F_4$ (tetrafluoroethene), $C_2F_6$ (hexafluoroethane), $C_3F_6$ (hexafluoropropene), $C_3F_8$ (octafluoropropane) and $C_4F_{10}$ (decafluorobutane) represented by the following general formulas (I) and (II), $$C_nX_{2n} \qquad (I)$$

$$C_nX_{2n+2} \qquad (II)$$

wherein X is H, F, Cl, Br or I, and n is 2, 3, 4 or 5, is also enclosed. The monitor gas is distributed throughout the inside of the tank and undergoes a chemical reaction to produce a product gas when local heating or corona takes place due to unusual operation. The concentration of the monitor gas or gases 4 in the tank 1 is preferabgly in a range of approximately 0.1 to 30% by weight. When the monitor gas concentration in the tank 4 is less than 0.1% by weight, it is quite difficult to detect a reaction product or products of the monitor gas or gases 4, and, in turn, when the monitor gas concentration in the tank 4 is larger than 30% by weight, it threatens to reduce the inherent insulating and cooling functions of the sealed gas 3. By varying the monitor gas concentration in the tank or enclosing a plurality of monitor gases in the tank, the reference local heating temperature to be regarded as an unusual condition can be somewhat properly determined. The insulating gas 3 and the monitor gas 4 may bbe charged at a pressure of 0.1 to 0.6 MPa in the tank 1 when the insulating gas 3 is employed for the insulation, and hence the tank 1 may be formed as a pressure container.

One one side wall of the tank 1, a combination of a cooler 6 and a circulating pump 7 is connected in series through upper and lower ducts 5a and 5b. The heated gas in the tank 1 is circulated from the lower portion to the upper portion thereof through the lower duct 5b, the pump 7, the cooler 6 and the upper duct 5a in sequence by the pump 7, while the heated gas is cooled in the cooler 6. As a result, the apparatus 2 to be monitored and other members in the tank 1 are cooled and insulated by the insulating gas 3 in the normal operation.

On the top of the tank 1, a pair of terminal members 8a and 8b are mounted, and the electric power is supplied fromn the outside to the apparatus 2 through the terminal members 8a and 8b and electric wires. On another side wall of the tank 1, a gas detector 11 such as a gas chromatograph and other gas sensors is mounted onto the lower portion via a pipe 9 and a valve 10. For example, when the gas chromatograph is used as the gas detector 11, the valve 10 is opened and the mixture gas in the tank 1 is picked up thorugh the pipe 9 to detect the reaction product of the monitor gas 4. When a gas sensor is employed in the similar manner thereto, the gas monitoring may be always carried out. In the operation, the valve 10 amy be repeatedly opened according to a monitoring program or may be opened at periodic inspections. The gas detector 11 may be detachably mounted and may be coupled to the tank 1 only when the inspection is conducted.

In the gas-charged apparatus containing the apparatus 2 to be monitored, for instance, in which $C_2F_4$ gas as the monitor gas 4 is included therein, when the partial heating as a premonitory stage before an accident arises in the apparatus 2, the monitor gas $C_2F_4$ is reacted in a dimerization reaction to produce a reaction product of $C_4F_8$ gas depending on the heating temperature as follows:

$$2C_2F_4 \xrightarrow[\text{dimerization}]{\text{heating}} C_4F_8$$

When the corona discharge as a premonitory stage following an accident is caused in the apparatus to be monitored, the monitor gas 4 is decomposed to product a reaction produce gas. For example, when $C_2F_4$ gas as the monitor gas 4 is used, the reaction is preformed as follows:

$$C_2F_4 \rightarrow C + CF_4$$

Alternatively, when $C_3F_8$ gas as the monitor gas 4 is used, the reaction is conducted as follows:

$$C_3F_8 \rightarrow CF_4 + C_2F_4$$

Thus, the monitor gas combines with itself or decomposes, without reacting with the insulating gas, to produce a product which can be detected, i.e., as noted above, the insulating gas is inert and nonflammable with respect to the monitor gas. Hence, according to the present invention, by detecting the reaction products such as $C_4F_8$ and $CF_4$ gases using the gas detector 11, unusual signs such as partial heatings and electric discharges or abnormalities of the apparatus 2 to be monitored can be known in the premonitory stage before the occurrence of an accident. At the same time, the cause of the abnormality, the partial heating or the partial corona discharge and be also determined. In this case, since the monitor gas 4 can be circulated together with the sealed gas 3 every nook and corner of the tank 1, even when the abnormality occurs in any unexpected portion, it can be certainly inspected.

Figure 2:
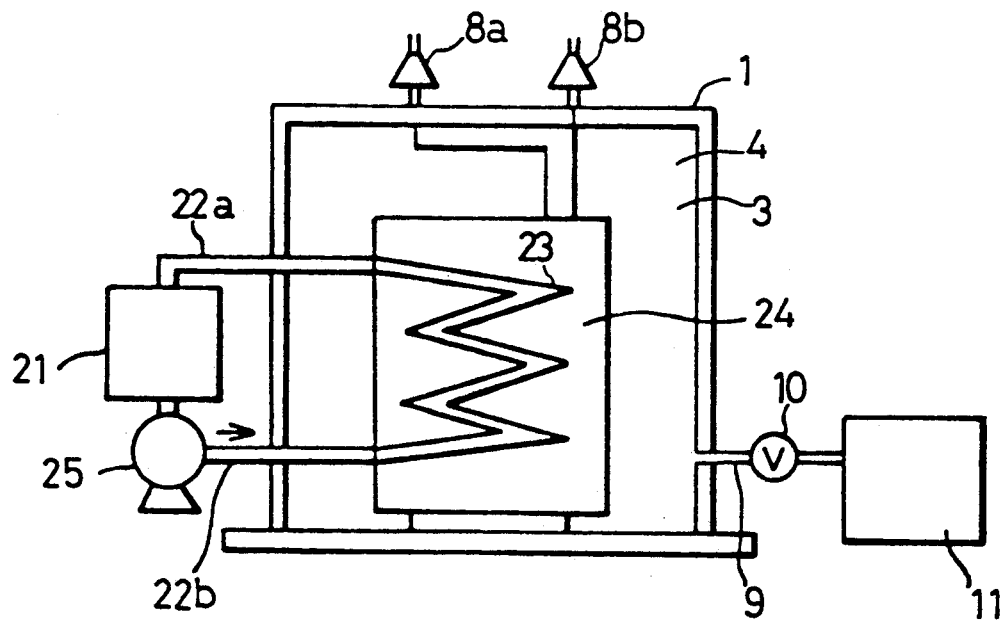
FIG. 2 is a schematic view of another embodiment of the gas-charged apparatus according to the present invention.

In FIG. 2, there is shown a second embodiment of a gas-charged apparatus including an unusual sign monitor according to the present invention, having the same construction as the embodoiment shown in FIG. 1, except that an apparatus 24 to be monitored is provided with a cooling device 23 therein, and a combination of a cooler 21 and a circulating pump 25 is connected in series with the cooling device 23 through upper and lower ducts 22a and 22b to form a closed cooling circle for directly cooling the apparatus 24 to be monitored. In this embodiment, the insulating gas 3 may function only in an insulating capocity without serving as a coolant to adopt a separation system. In this case, the apparatus 24 to be monitored can be effectively cooled. The same effects and advantages as those of the first embodiment described above can be, of course, obtained.

Figure 3:
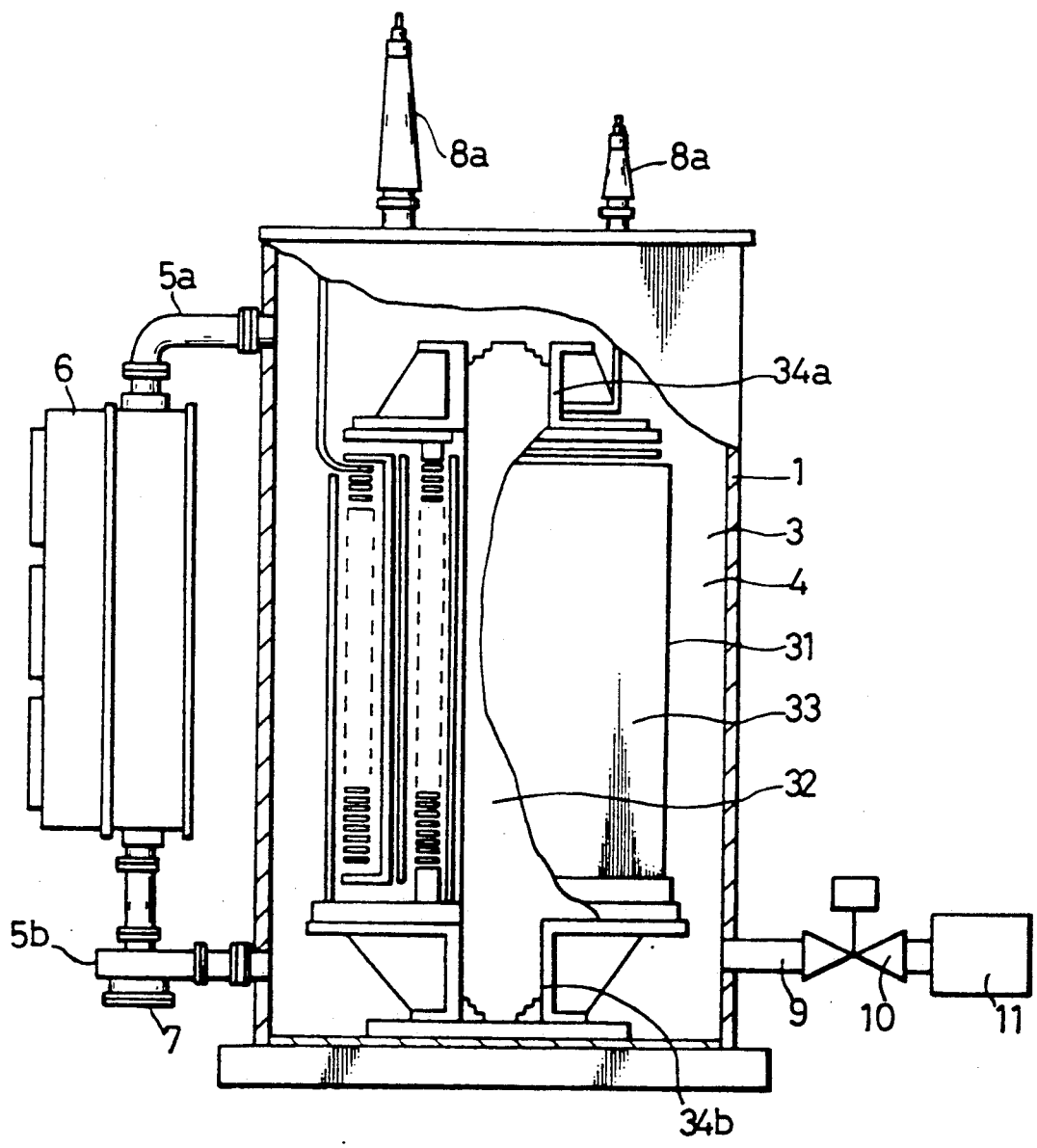
FIG. 3 is a schematic view of a further embodiment of the gas-charged apparatus according to the present invention, which materializes a gas-insulated transformer.

In FIG. 3, there is shown a third embodiment of a gas-charged apparauts including an unusual sign monitor according to the present invention, in which a gas-insulated transformed is realized. In this embodiment, a transformer body 31 to be monitored includes an iron core 32, a coil 33 wound on the core 32, and upper and lower clamp members 34a and 34b for clamping the upper and lower portions of the core 32. The same effects and advantages as those of the first embodiment can be obtained.

Figure 4:
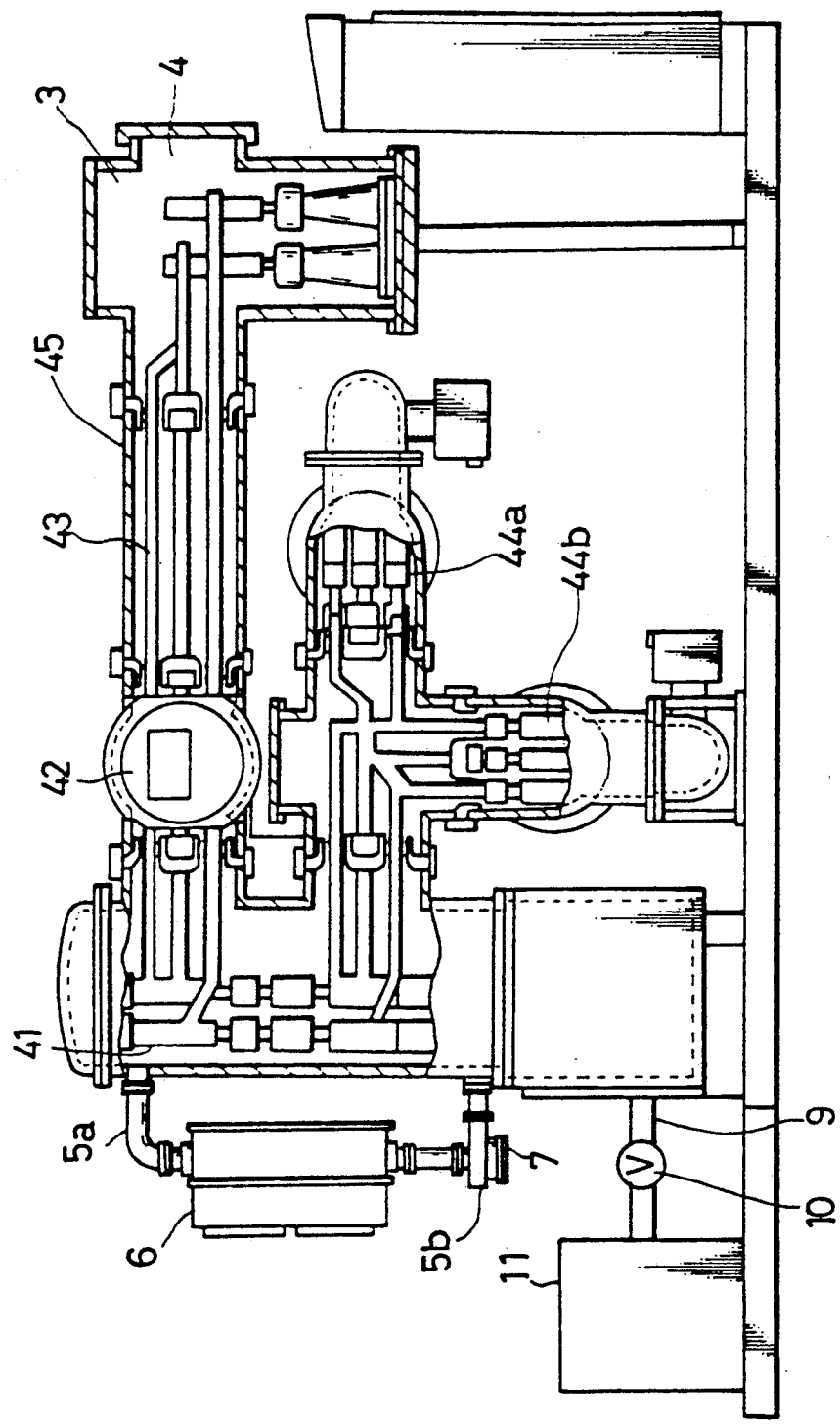
FIG. 4 is a shcematic view of still another embodiment inevention, realizing a gas insulated switchgear or gas circuit brreaker.

In FIG. 4, there is shown a fourth embodiment of a gas-charged apparatus including an unusual sign monitor according to the present invention, in which a gas insulated switch gear, gas circuit breaker and is materialized. In this case, an apparatus 2 to be monitored comprises breakers 41, disconnectors 42, conductors 43, bus-disconnectors 44a and 44b and so forth for three-phase power, which are all equipped within a metallic tank 45 having a somewhat complicated shape. A pair of electric terminal members are omitted for the brevity in FIG. 4. The same effects and advantages as those obtained in the first embodiment can be resulted.

According to the present invention, in addition to the electric equipments and apparatuses such as breakers, disconnectors, conductors, bus-disconnectors, switches, buses, transformers and the like, other apparatuses such as turbines may be monitored in a gas-charged apparatus.

Now, corona discharge tests and heat reaction tests for explaining the concept of the present invention will be described in detail in connection with FIGS. 5 to 16.

Corona Discharge Test

Figure 5:
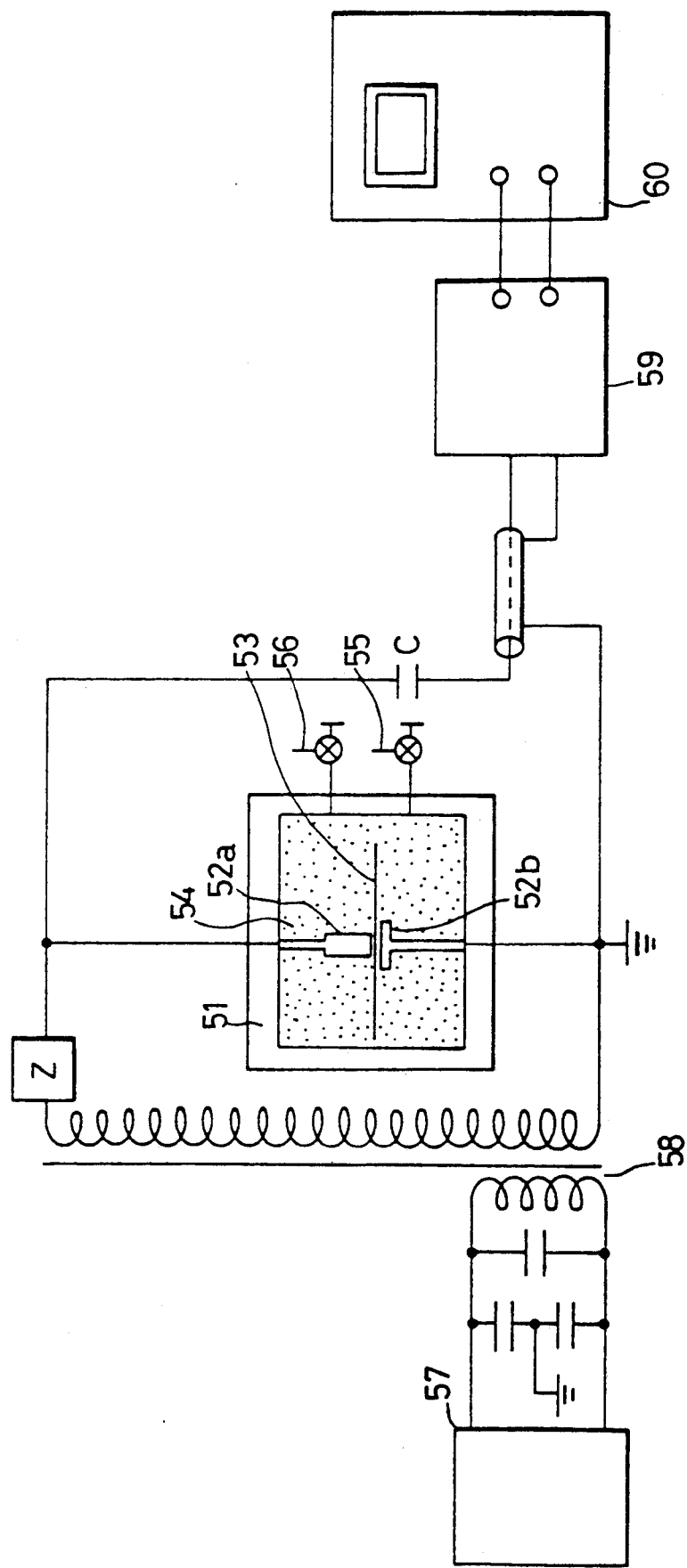
FIG. 5 is a schematic explanatory view of a corona dischargiung apparatus for use in a corona discharge test according to the present invention.

The corona discharge test was conducted using a conventional corona discharge apparatus shown in FIG. 5. First, apair of electrodes for generating corona, i.e., an impression electrode 52a having a diameter of 5 mm and a flat tip surface with an edge of 2R and an earth electrode 52b having a diameter of 10 mm and a flat tip surface with an edge of 2R were mounted in an insulating airtight container 51 with an inside volume capacity of 200 ml. An insulating film 53 having an outer diameter of 40 mm and a thickness of 250 μm was interposed between the two electrodes 52a and 52b. The monitor gas 54 such as a single gas of $C_2F_4$ gas or a mixture gas of $C_2F_4$ and $C_3F_8$ gases was introduced into the container 51 at a pressure of 3 kg/cm$^2$ (G) through a sampling inlet 55. Another inlet 56 was used for adjusting the gas in and out of the container 51.

A power source 57 was connected to the two electrodes 52a and 52b via a testing transformer 58 therebetween. The secondary voltage was increased to 500 V/sec and a slight corona discharge was generated between the two electrodes 52a and 52b in the container 51. The detection of the corona discharge was caused using a coupled capacitor detection method. The generated corona pulse was measured by a synchronscope 60 via a partial discharge detector 59 to obtain a maximum electric charge of the corona discharge. In this case, the maximum electric charge was adjustable to 1000 pC (pico-coulomb), 1500 pC, 2000 pC and 10000 pC, respectively, and the analysis of the gas in the container 51 was carried out at a certain discharge time interval under the given conditions. The gas analysis was conducted before and after the corona discharge test using a gas chromatograph and a mass spectrometer to identify the gas contents.

Figure 6:
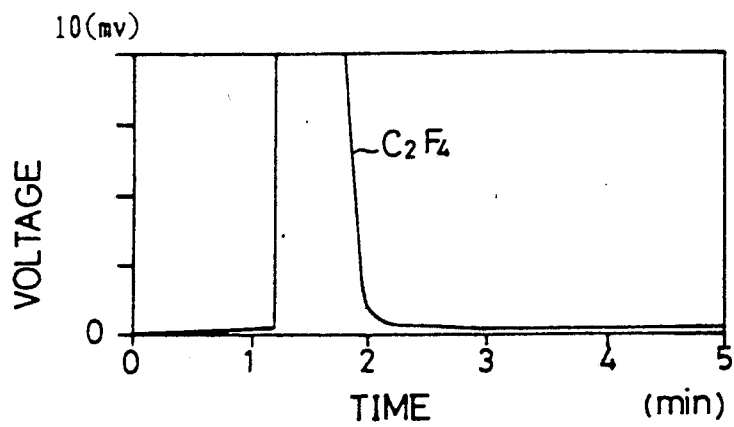
FIGS. 6 to 9 are graphical representations showing gas analysis patterns of samples obtained in a corona discharge, as shown in FIG. 5, using the gas chromatography.
Figure 7:
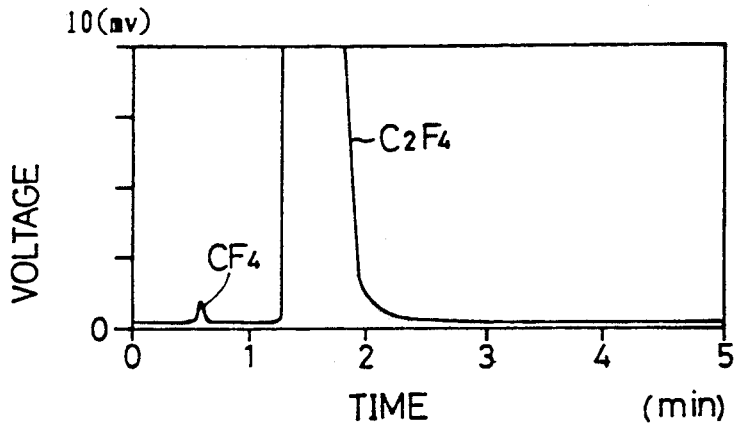
Figure 8:
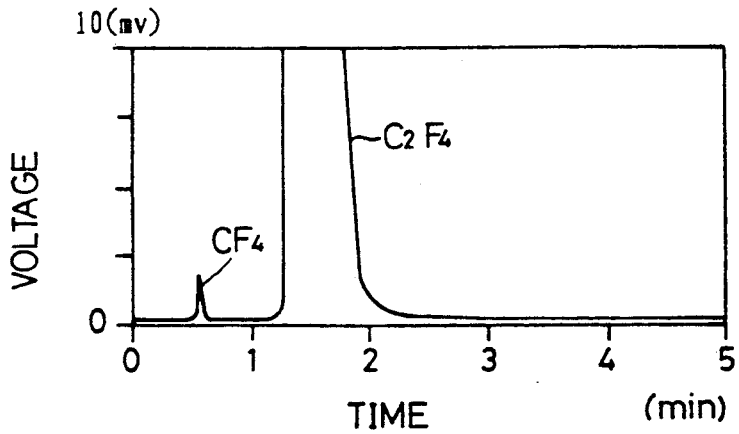
Figure 9:
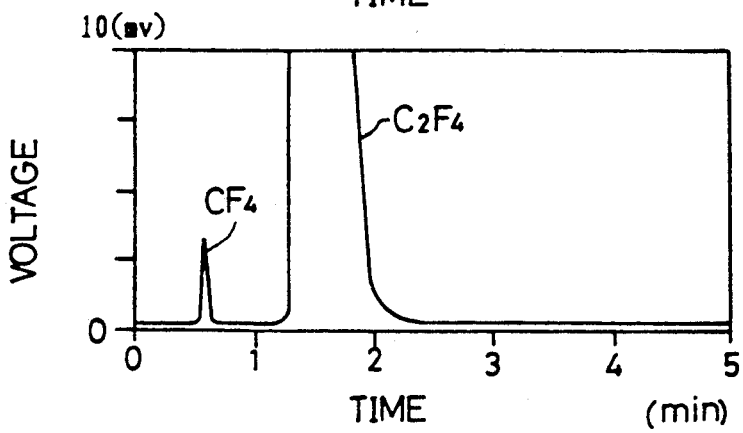

In FIGS. 6 to 9, there is shown the result of one example of the gas content identification using only $C_2F_4$ gas (100%) as the monitor gas at the maximum electric charge of 200 pC before the corona discharge test and at 25, 80, 165 and 285 minutes after the same. As shown in FIG. 6, only $C_2F_4$ gas was detected before the corona discharge test, and after the corona discharge test, $CF_4$ gas generated was also detected, as shown in FIGS. 7 to 9. That is, when the corona discharge is caused, $C_2F_4$ gas is reacted as follows:

$$C_2F_4 \rightarrow C + CF_4$$

Figure 10:
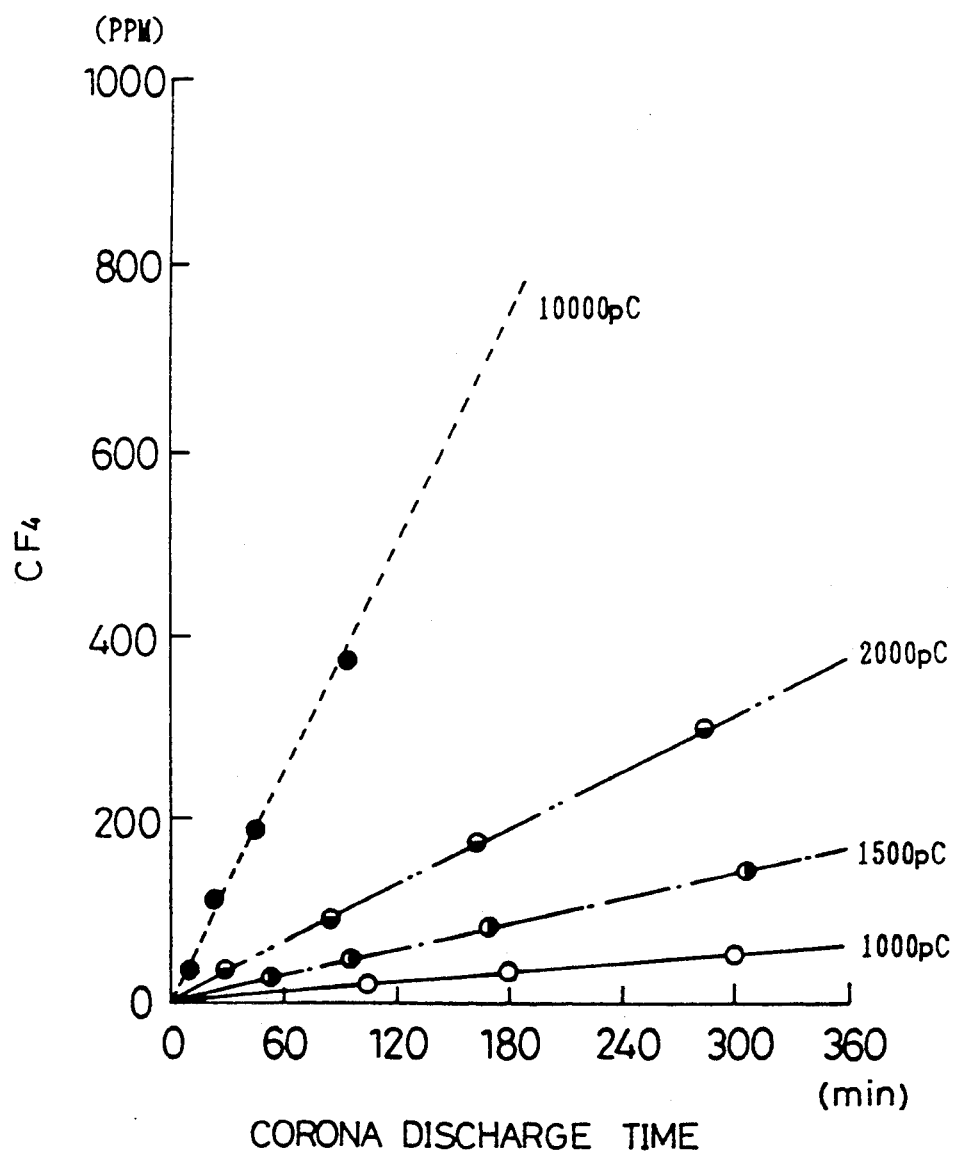
FIGS. 10 and 11 are graphical representations showing a relation between gas generation amount and discharge time in a thermal reaction using 100% of $C_2F_4$ monitor gas and a mixture of 50% of $C_2F_4$ and 50% of $C_3F_8$ monitor gases according to the present invention.

The relation between the amount of the generated $CF_4$ gas and the corona discharge time at the maximum electric charge of 1000, 1500, 2000 or 10000 pC is illustrated in FIG. 10.

Figure 11:
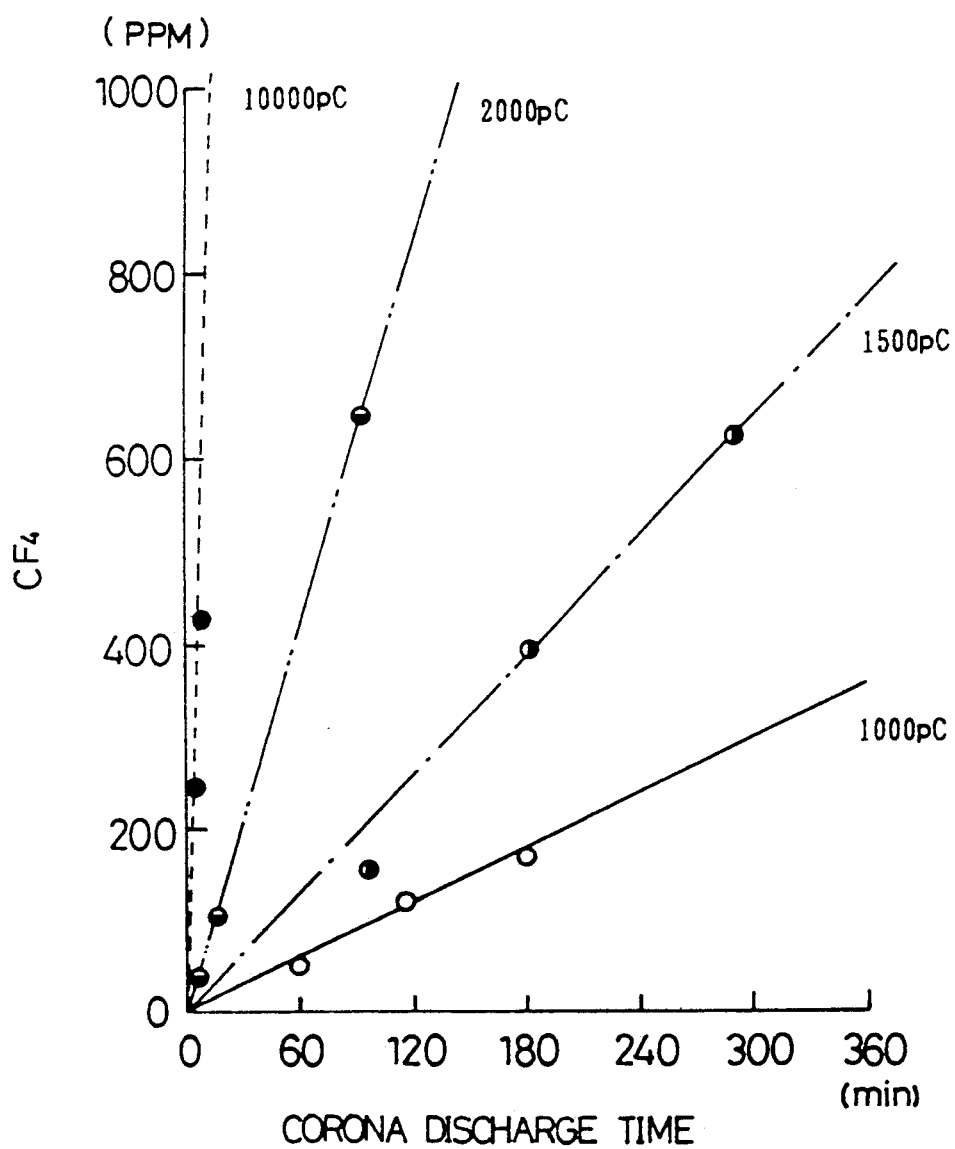

In FIG. 11, there is shown the relation between $CF_4$ gas amount and the corona discharge time, which is obtained by other examples of the gas content identification using a mixture gas of $C_2F_4$ gas (50%) and $C_3F_8$ gas (50%) as the monitor gas in the same manner as described above. In this case, the inclinations of the characteristics lines are larger than those shown in FIG. 10 for the reason that in addition to the reaction of $C_2F_4$ and to produce $CF_4$ gas, as described above, $C_3F_8$ gas is also reacted to produce $CF_4$ gas in the following:

$$C_3F_8 \rightarrow CF_4 + C_2F_4$$

It is readily understood that, when the electric discharge is caused in the gas-charged apparatus of the present invention, the monitor gas such as $C_2F_4$ and $C_3F_8$ is decomposed to produce $CF_4$ gas therein, and by detecting the $CF_4$ gas, the unusual sign such a. the partial discharge or the abnormality can be known. The degree of the abnormality can be estimated from the generated $CF_4$ gas amount. Furthermore, since the monitor gas can be circulated into every nook and corner within the tank, even when the abnormality arises in any unexpected portion, it can be exactly known.

Figure 12:
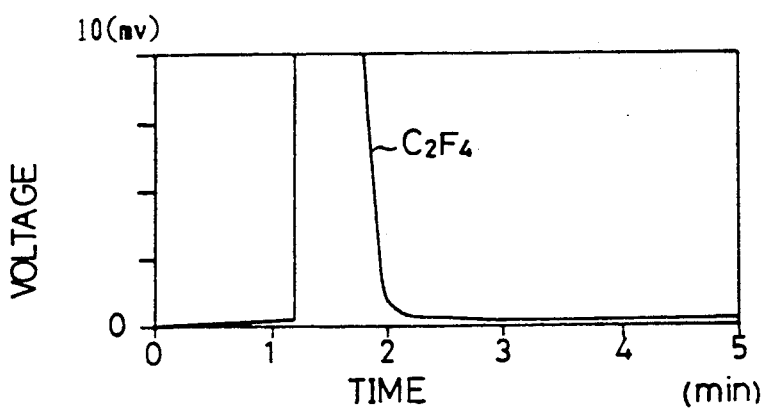
FIGS. 12 to 15 are graphical representations, like FIGS. 6 to 9, showing gas analysis patterns of samples obtained in a partial heating using the gas chromatography.
Figure 13:
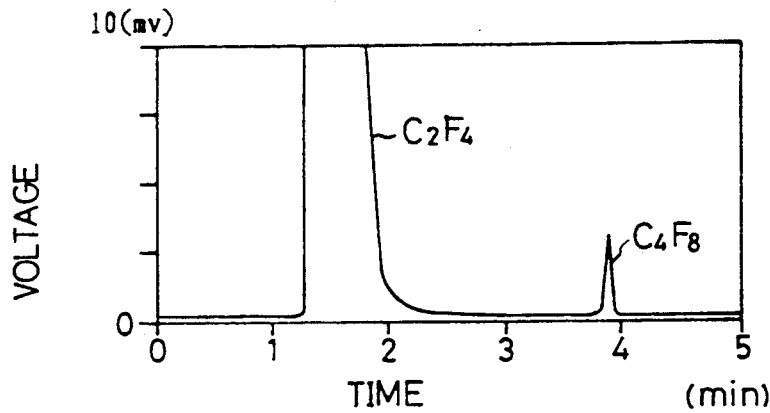
Figure 14:
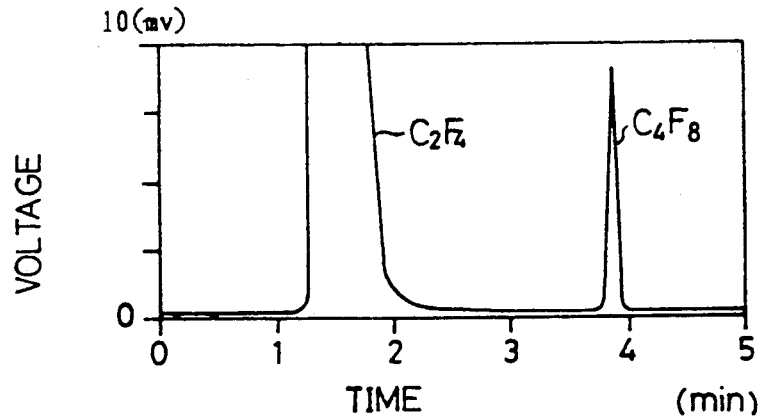
Figure 15:
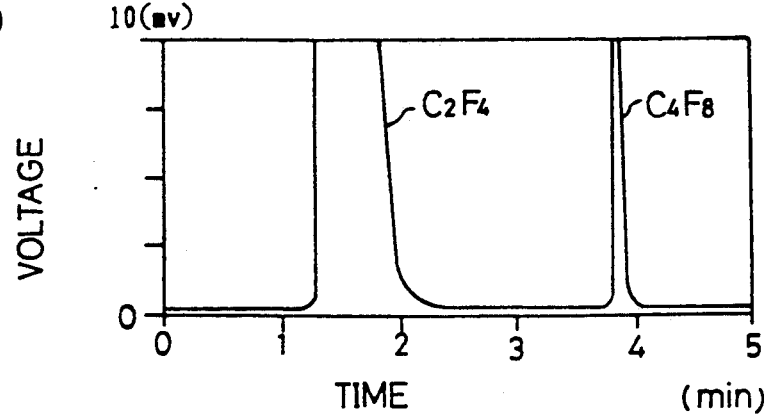

Heat Reaction Test $C_3F_4$ gas a monitor gas was charged into an airtight stainless stell cylinder having a content capacity of 75 ml at a charging pressure of 3 kg/cm². The cylinder was fixed in an electric thermostatic chamber whose reaction temperatures were adjusted in condition in advance to carry out the heat reaction. Then, the reaction was carried out, and the gas in the cylinder was analyzed at 8 hours, 17 hours, 42 hours, 64 hours and 80 hours at 130° C., 96 hours, 113 hours, 131 hours, 140 hours and 160 hours at 150° C. and then 165 hours, 175 hours, 184 hours and 194 hours at 180° C. The gas analysis was performed before and after the heat reaction test in the same manner as described above. The obtained results are shown in FIGS. 12 to 15. As shown in FIG. 12, only $C_2F_4$ gas was detected before the heat reaction test, and after the heat reaction test, $C_4F_8$ gas generated was also detected, as shown in FIGS. 13 to 15. That is, the monitor gas of $C_2F_4$ is reacted by heating as follows:

$$2C_2F_4 \rightarrow C_4F_8$$

Figure 16:
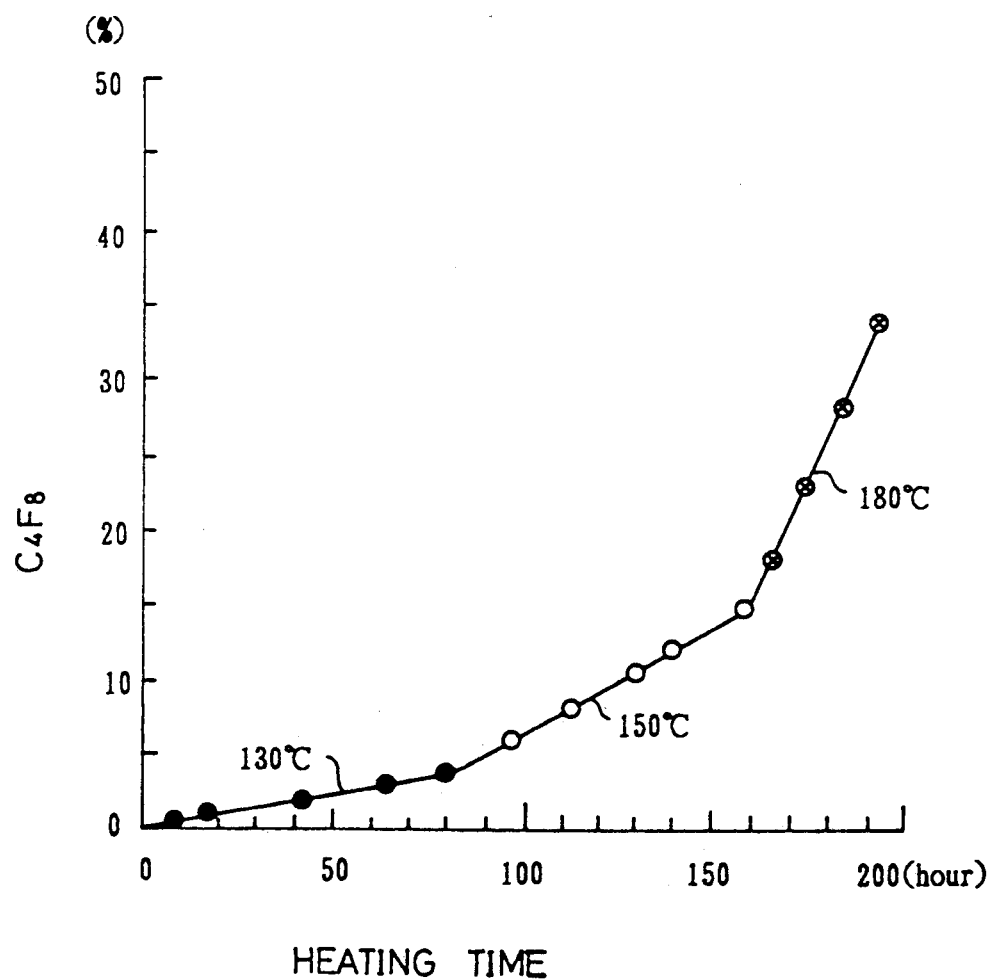
FIG. 16 is a graphical representation showing a relation between gas generation amount and heating time in a thermal reaction using 100% of $C_2F_4$ monitor gas according to the present invention.

FIGS. 13 to 15 illustrate gas chromatograph patterns at 80 hours at 130° C., 160 hours at 150° C. and 194 hours at 180° C., respectively. In FIG. 16, there is shown the relation between the generated $C_4F_8$ gas rate and the heating time at the temperature of 130° C., 150° C. and 180° C.

It is readily understood that, when the partial heating is caused in the gas-charged apparaus of the present invention, the monitor gas such as $C_2F_4$ is decomposed by heating to generate $C_4F_8$, and by detecting the generated gas, the unusual sign of the partial heating or the abnormality can be known. The extent of the abnormality can be estimated from the amount of the generated gas $C_4F_8$. When working curves or lines like ones shown in FIG. 16 are prepared in advance, by comparing the inclinations of the characteristics curves or lines with those of the working curves or lines, the temperatures of the heating portions can be estimated, and the estimated temperatures can be utilized for assuming the heating portions. Furthermore, since the monitor gas can be circulated into every nook and corner within the tank, even when the abnormality is caused in any unexpected portion, it can be exactly known.

As described above, according to the present invention, when unusual signs such as partial heatings and electric discharges of abnormalities following troubles or accidents are casued in an apparatus to be monitored such as a gas-insulated transformer, gas-insulated switchgear, gas cicuit breaker and, turbine and the like within an airtight tank, nonitor gas or gases contained in the tank are decomposed to generate reaction product gas or gases, and the generated gas or gases are detected by a gas detector to exactly monitor slight abnormalities such as the unusual signs, without affecting any influneces to insulating and cooling abilities of a sealed gas for insulating and cooling the apparatus to be monitored. Accordingly, the troubles or accidents arising any portions within the tank can be effectively prevented. Furthermore, at the same time, the cause of the abnormality, the partial heating or the partial corona discharge can be determined, and the degree of the abnormality can be also estimated. Thus, the industrial worth of the present invention is extremely high.

Although the present invention has been described in its preferred embodiments with reference to the accompanying drawings, it is readily understood that the present invention is not restricted to the preferred embodiments and that the various charges and modifications of the present invention may be made by one skilled in the art without departing from the spirit and scope of the present invention.

What is claimed is:

1. A method for monitoring abnormal states in an apparatus to be monitored, comprising:
    enclosing an insulating gas into a tank containing an apparatus;
    adding to said insulting gas at least one monitor gas selected from the the group consisting of gases represented by formulas (I) and (II), $$C_nX_{2n} \quad (I)$$

$$C_nX_{2n+2} \quad (II)$$

wherein X is at least one of H, F, Cl, Br and I, and n is one of 2, 3, 4 and 5; and
    detecting a reaction product gas produced by a chemical reaction of the monitor gas within said tank, geneated due to an abnormal state of the apparatus to be monitored, using a detector.

2. The method of claim 1, wherein the apparatus to be monitored is one of gas-insulated transformer, gas-insulated switchgear, gas circuit breaker and turbine.

3. The method of claim 1, wherein said monitor gas is selected from the group of gases consisting of $C_2F_4$, $C_2F_6$, $C_3F_6$, $C_3F_8$ and $C_4F_{10}$.

4. The method of claim 1, wherein the concentration of the monitor gas in the tank is in a range of approximately 0.1 to 30% by weight.

5. The method of claim 1, wherein the insulating gas is selected from the group consisting of $SF_6$ and air.

6. The method of claim 1, wherein the gases in the tank are cooled using a cooler.

7. The method of claim 1, wherein the apparatus to be monitored is directly cooled using a cooler.

* * * * *